United States Patent
Yu et al.

(10) Patent No.: US 11,430,361 B2
(45) Date of Patent: Aug. 30, 2022

(54) INTEGRATED CIRCUIT AND DISPLAY DEVICE AND ANTI-INTERFERENCE METHOD THEREOF

(71) Applicant: Novatek Microelectronics Corp., Hsinchu (TW)

(72) Inventors: Hsi-Mao Yu, Tainan (TW); Chin-Hung Hsu, Taoyuan (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/261,586

(22) Filed: Jan. 30, 2019

(65) Prior Publication Data

US 2019/0236996 A1 Aug. 1, 2019

Related U.S. Application Data

(60) Provisional application No. 62/724,015, filed on Aug. 28, 2018, provisional application No. 62/666,662, (Continued)

(51) Int. Cl.
 *G09G 3/20* (2006.01)
 *H05K 9/00* (2006.01)
 *G06F 3/041* (2006.01)

(52) U.S. Cl.
 CPC .......... *G09G 3/20* (2013.01); *G06F 3/0412* (2013.01); *G09G 3/2092* (2013.01);
 (Continued)

(58) Field of Classification Search
 CPC .................................................. G09G 2330/06
 See application file for complete search history.

(56) References Cited

U.S. PATENT DOCUMENTS

| 8,304,997 B2 | 11/2012 | Kim et al. |
| 8,907,939 B2 * | 12/2014 | Liu ...................... G09G 3/2096 345/212 |

(Continued)

FOREIGN PATENT DOCUMENTS

| CN | 201845326 | 5/2011 |
| CN | 103903577 | 7/2014 |

(Continued)

OTHER PUBLICATIONS

"Office Action of Taiwan Counterpart Application", dated Mar. 24, 2020, p. 1-p. 3.

(Continued)

*Primary Examiner* — William Boddie
*Assistant Examiner* — Bipin Gyawali
(74) *Attorney, Agent, or Firm* — JCIPRNET (57) ABSTRACT

An integrated circuit (IC), a display device and an anti-interference method thereof are provided. The IC includes an input pad, a source driving circuit and an anti-interference circuit. The input pad receives an input signal comprising image data from the external. The source driving circuit is coupled to the input pad to receive the input signal. The anti-interference circuit is coupled to the input pad to provide a variable capacitance. The anti-interference circuit adjusts the variable capacitance from a normal capacitance value to at least one anti-interference capacitance value when an interference event occurs to the input signal. The anti-interference circuit maintains the variable capacitance at the normal capacitance value when the interference event does not occur.

38 Claims, 9 Drawing Sheets

Related U.S. Application Data filed on May 3, 2018, provisional application No. 62/624,073, filed on Jan. 30, 2018.

(52) U.S. Cl.
CPC ... *H05K 9/0022* (2013.01); *G09G 2310/0264* (2013.01); *G09G 2330/04* (2013.01); *G09G 2330/06* (2013.01); *G09G 2370/08* (2013.01)

(56) References Cited

U.S. PATENT DOCUMENTS

| | | | |
|---|---|---|---|
| 9,508,277 B2 | 11/2016 | Shie et al. | |
| 9,570,039 B2 | 2/2017 | Shie et al. | |
| 9,881,579 B2* | 1/2018 | Oh | G09G 3/3688 |
| 2005/0200590 A1* | 9/2005 | Kumekawa | G09G 3/20 |
| | | | 345/100 |
| 2009/0079716 A1* | 3/2009 | Kim | G09G 3/2092 |
| | | | 345/204 |
| 2010/0110040 A1 | 5/2010 | Kim et al. | |
| 2010/0207550 A1 | 8/2010 | Kim et al. | |
| 2014/0098056 A1 | 4/2014 | Huang et al. | |
| 2014/0184574 A1 | 7/2014 | Shie et al. | |
| 2014/0184582 A1 | 7/2014 | Shie et al. | |
| 2014/0292742 A1* | 10/2014 | Oh | G09G 3/3688 |
| | | | 345/212 |
| 2016/0148565 A1 | 5/2016 | Wang | |
| 2016/0155373 A1* | 6/2016 | Jang | G09G 3/3648 |
| | | | 345/691 |
| 2016/0163284 A1* | 6/2016 | Morita | G09G 3/3688 |
| | | | 345/215 |
| 2017/0011696 A1* | 1/2017 | Kim | G09G 3/3648 |
| 2020/0111437 A1 | 4/2020 | Wang | |

FOREIGN PATENT DOCUMENTS

| | | |
|---|---|---|
| CN | 103903576 | 9/2017 |
| CN | 107154243 | 9/2017 |
| WO | 2009038419 | 3/2009 |

OTHER PUBLICATIONS

"Office Action of China Counterpart Application", dated Jan. 5, 2022, p. 1-p. 11.

* cited by examiner

INTEGRATED CIRCUIT AND DISPLAY DEVICE AND ANTI-INTERFERENCE METHOD THEREOF

CROSS-REFERENCE TO RELATED APPLICATION

This application claims the priority benefits of U.S. provisional application Ser. No. 62/624,073, filed on Jan. 30, 2018, U.S. provisional application Ser. No. 62/666,662, filed on May 3, 2018, and U.S. provisional application Ser. No. 62/724,015, filed on Aug. 28, 2018. The entirety of each of the above-mentioned patent applications is hereby incorporated by reference herein and made a part of this specification.

BACKGROUND

Field of the Invention

The invention relates to a display device and more particularly, to an integrated circuit (IC) and an anti-interference method thereof.

Description of Related Art

When a mobile phone (or another radio frequency (RF) apparatus) approaches a display device, an RF noise may cause abnormality to a display screen of the display device. One of the reasons that causes the normality is that the RF noise of the mobile phone may probably interfere data signal transmission between a timing controller and a source driving circuit.

Figure 1:
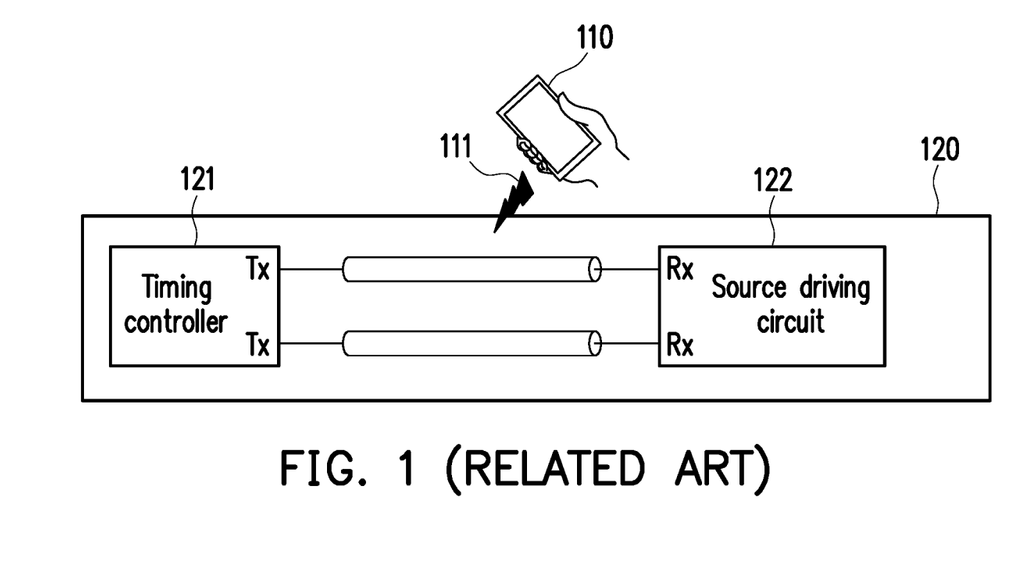
FIG. 1 is a schematic diagram illustrating a scenario that a mobile phone approaches a display device.

FIG. 1 is a schematic diagram illustrating a scenario that a mobile phone 110 approaches a display device 120. A timing controller 121 transmits a data signal to a source driving circuit 122 via a transmission wire, and the source driving circuit 122 drives a display panel according to the data signal to display an image. When the mobile phone 110 approaches the display device 120, a RF noise 111 of the mobile phone 110 may probably interfere data signal transmission between the timing controller 121 and the source driving circuit 122. When an energy of the RF noise in the data signal is large enough, the source driving circuit 122 may probably fail to correctly latch the data signal.

Figure 2:
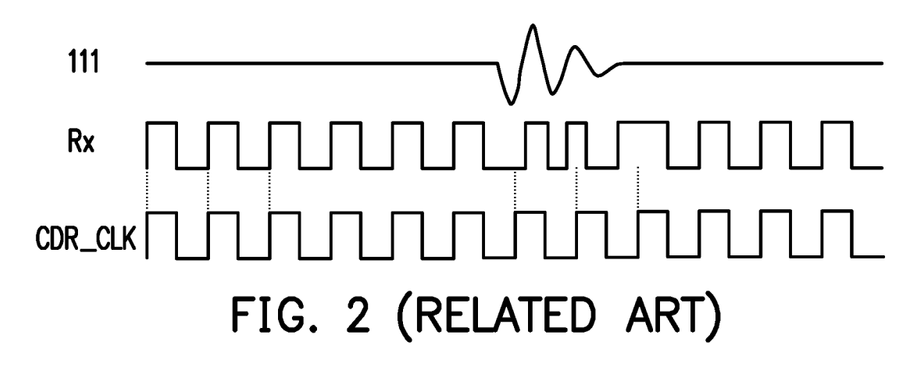
FIG. 2 is a schematic diagram illustrating a scenario that the signal received by the source driving circuit depicted in FIG. 1 is interfered by a radio frequency (RF) noise.

FIG. 2 is a schematic diagram illustrating a scenario that the signal received by the source driving circuit 122 depicted in FIG. 1 is interfered by the RF noise. In FIG. 2, the horizontal axis represents the time. In FIG. 2, Rx represents the data signal received by the source driving circuit 122, and CDR_CLK represents a clock signal of a clock data recovery (CDR) circuit inside the source driving circuit 122. As illustrated in the left part of FIG. 2, when the RF noise 111 does not yet occur, the CDR circuit inside the source driving circuit 122 is capable of correctly locking the data signal Rx, namely, a phase of the data signal Rx may match a phase of the clock signal CDR_CLK. When the RF noise 111 occurs, the RF noise 111 interferes the data signal Rx, which causes the phase of the data signal Rx to not match the phase of the clock signal CDR_CLK. Namely, the CDR circuit inside the source driving circuit 122 may trigger loss of lock to the data signal. When the source driving circuit 122 is incapable of correctly locking the data signal Rx, the display panel of the display device 120 certainly cannot display the correct image.

It should be noted that the content of the section of "Description of Related Art" is used for facilitating the understanding of the invention. A part of the content (or all content) disclosed in the section of "Description of Related Art" may not pertain to the conventional technique known to the persons with ordinary skilled in the art. The content disclosed in the section of "Description of Related Art" does not represent that the content has been known to the persons with ordinary skilled in the art prior to the filing of this invention application.

SUMMARY

The invention provides an integrated circuit, a display device and an anti-interference method thereof for determining whether or not an interference event occurs to an input signal, so as to determine whether to adjust a variable capacitance of an anti-interference circuit dynamically according to a determination result.

According to an embodiment of the invention, an integrated circuit configured to drive a display panel is provided. The integrated circuit includes at least one input pad, a source driving circuit and an anti-interference circuit. The at least one input pad is configured to receive an input signal including image data from the external. The source driving circuit is coupled to the at least one input pad to receive an input signal. The source driving circuit processes the input signal to generate output data to drive the display panel. The anti-interference circuit is coupled to the at least one input pad to provide a variable capacitance. When an interference event occurs to the input signal, the anti-interference circuit is configured to adjust the variable capacitance from a normal capacitance value to at least one anti-interference capacitance value. When the interference event does not occur, the anti-interference circuit is configured to maintain the variable capacitance at the normal capacitance value.

According to an embodiment of the invention, an anti-interference method of an integrated circuit is provided. The integrated circuit is configured to drive a display panel. The anti-interference method includes: receiving an input signal including image data from the external through at least one input pad by a source driving circuit; processing the input signal to generate output data by the source driving circuit to drive the display panel; providing a variable capacitance to the at least one input pad by an anti-interference circuit; adjusting the variable capacitance from a normal capacitance value to at least one anti-interference capacitance value by the anti-interference circuit when an interference event occurs to the input signal; and maintaining the variable capacitance at the normal capacitance value by the anti-interference circuit when the interference event does not occur.

According to an embodiment of the invention, a display device is provided. The display device includes a display panel, printed circuit board, a first integrated circuit, a second integrated circuit and an anti-interference circuit. The printed circuit board is coupled to the display panel. The first integrated circuit is disposed on the printed circuit board. The second integrated circuit is disposed on the display panel. The second integrated circuit is electrically coupled to the first integrated circuit via at least one conductive wire of the printed circuit board to receive an input signal comprising image data. The anti-interference circuit is disposed on the printed circuit board. The anti-interference circuit is coupled to the at least one conductive wire to provide variable capacitance. When an interference event occurs to the input signal, the anti-interference circuit is configured to adjust the variable capacitance from a normal capacitance value to at least one anti-interference capacitance value. When the interference event does not occur, the anti-interference circuit is configured to maintain the variable capacitance at the normal capacitance value.

To sum up, the integrated circuit, the display device and the anti-interference method provided by the embodiments of the invention can determine whether or not the interference event occurs to the input signal. When the interference event occurs, the variable capacitance of the anti-interference circuit can be dynamically adjusted from the normal capacitance value to the anti-interference capacitance value, so as to suppress the radio frequency (RF) noise. When the interference event does not occur, the variable capacitance of the anti-interference circuit may be maintained at (adjusted back to) the normal capacitance value.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

A term "couple" used in the full text of the disclosure (including the claims) refers to any direct and indirect connections. For instance, if a first device is described to be coupled to a second device, it is interpreted as that the first device is directly coupled to the second device, or the first device is indirectly coupled to the second device through other devices or connection means. The terms "first" and "second" mentioned in the full text of the specification (including the claims) are used to name the elements, or for distinguishing different embodiments or scopes, instead of restricting the upper limit or the lower limit of the numbers of the elements, nor limiting the order of the elements. Moreover, wherever possible, components/members/steps using the same referral numerals in the drawings and description refer to the same or like parts. Components/members/steps using the same referral numerals or using the same terms in different embodiments may cross-refer related descriptions.

Figure 3:
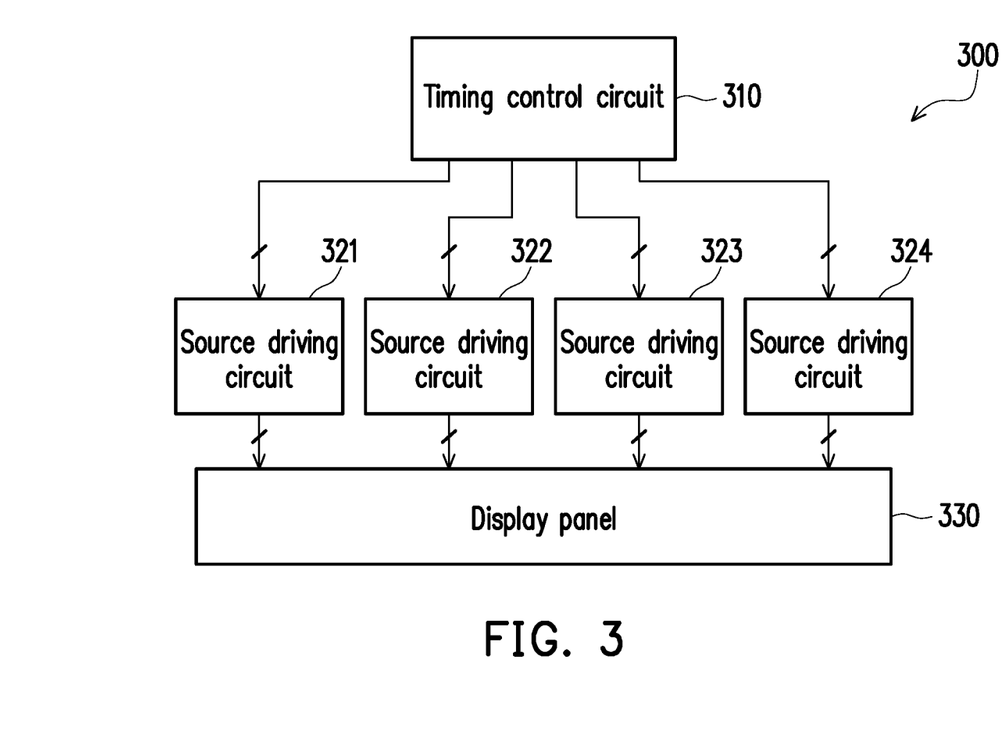
FIG. 3 is a schematic circuit block diagram illustrating a display device according to an embodiment of the invention.

FIG. 3 is a schematic circuit block diagram illustrating a display device 300 according to an embodiment of the invention. The display device 300 includes a driving circuit and a display panel 330. The implementation manner of the display panel 330 is not limited in the present embodiment. Based on a design requirement, for example, the display panel 330 may be a conventional display panel or any other display panel. The driving circuit may include one or more integrated circuits (ICs), for example, one or more IC, a timing control circuit 310 and one or more source driving circuits illustrated in FIG. 3. FIG. 3 illustrates 4 source driving circuits 321, 322, 323 and 324. In any way, the number of the source driving circuits is determined based on a design requirement. The source driving circuits 321-324 are configured to be controlled by the timing control circuit 310. The timing control circuit 310 transmit data signals to the source driving circuits 321-324 via transmission wires (for example, conductive wires of a printed circuit board), and the source driving circuits 321-324 drive the display panel 330 according to the data signals to display images.

Figure 4:
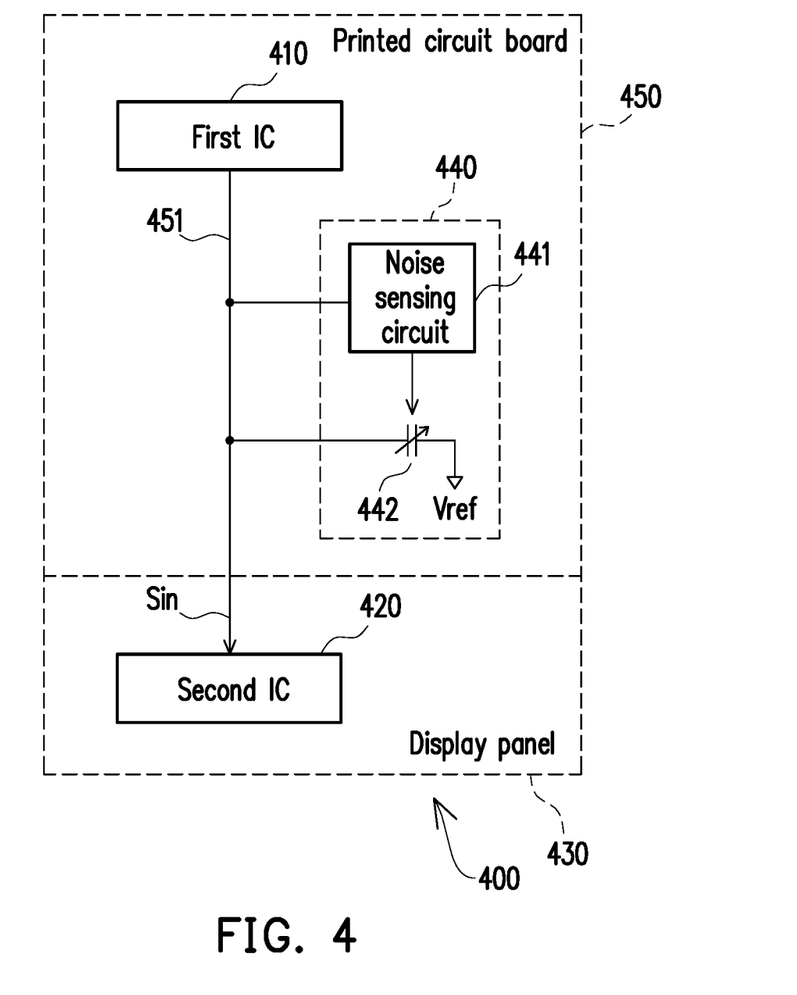
FIG. 4 is a schematic circuit block diagram illustrating a display device according to another embodiment of the invention.

FIG. 4 is a schematic circuit block diagram illustrating a display device 400 according to another embodiment of the invention. The display device 400 includes a first IC 410, a second IC 420, a display panel 430, an anti-interference circuit 440 and a printed circuit board 450. The display panel 430 illustrated in FIG. 4 may be inferred with reference to the description related to the display panel 330 illustrated in FIG. 3 and thus, will not be repeated. Based on a design requirement, the first IC 410 illustrated in FIG. 4 may include the timing control circuit 310 and/or other circuits illustrated in FIG. 3, and the second IC 420 illustrated in FIG. 4 may include any one of the source driving circuits 321-324 and/or other circuits illustrated in FIG. 3.

The printed circuit board 450 is coupled to the display panel 430. The first IC 410 and the anti-interference circuit 440 are disposed on the printed circuit board 450. The second IC 420 is disposed on the display panel 430. The second IC 420 is electrically coupled to the first IC 410 via at least one conductive wire 451 of the printed circuit board 450 to receive an input signal Sin including image data. The anti-interference circuit 440 is coupled to the conductive wire 451 of the printed circuit board 450 to provide a variable capacitance. When an interference event does not occur, the anti-interference circuit 440 may maintain the variable capacitance at a normal capacitance value. The normal capacitance value may be determined based on a design requirement. For example, in some embodiments, the normal capacitance value may be 0. When the interference event occurs to the input signal Sin, the anti-interference circuit 440 may adjust the variable capacitance from the normal capacitance value to at least one anti-interference capacitance value. The anti-interference capacitance value may be determined based on a design requirement. For example, in some embodiments, the anti-interference capacitance value may be any real number greater than the normal capacitance value. When the interference event disappears, the anti-interference circuit 440 may return the variable capacitance from the anti-interference capacitance value to the normal capacitance value.

The implementation manner of the anti-interference circuit 440 is not limited in the present embodiment. For example, the anti-interference circuit 440 illustrated in FIG. 4 includes a noise sensing circuit 441 and a variable capacitor 442. A first node of the variable capacitor 442 is coupled to the conductive wire 451. A second node of the variable capacitor 442 is coupled to a reference voltage level Vref. The noise sensing circuit 441 may detect whether or not the interference event occurs to the input signal Sin. The noise sensing circuit 441 of the anti-interference circuit 440 may detect at least one of a frequency of the input signal Sin, a common-mode level of the input signal Sin and a swing of the input signal Sin, so as to obtain a detection result indicating whether or not the interference event occurs. The noise sensing circuit 441 may determine whether to dynamically adjust or maintain a capacitance value (i.e., a variable capacitance) of the variable capacitor 442 according to the detection result. Based on the control of the noise sensing circuit 441, the variable capacitor 442 may provide the variable capacitance to the conductive wire 451.

Figure 5:
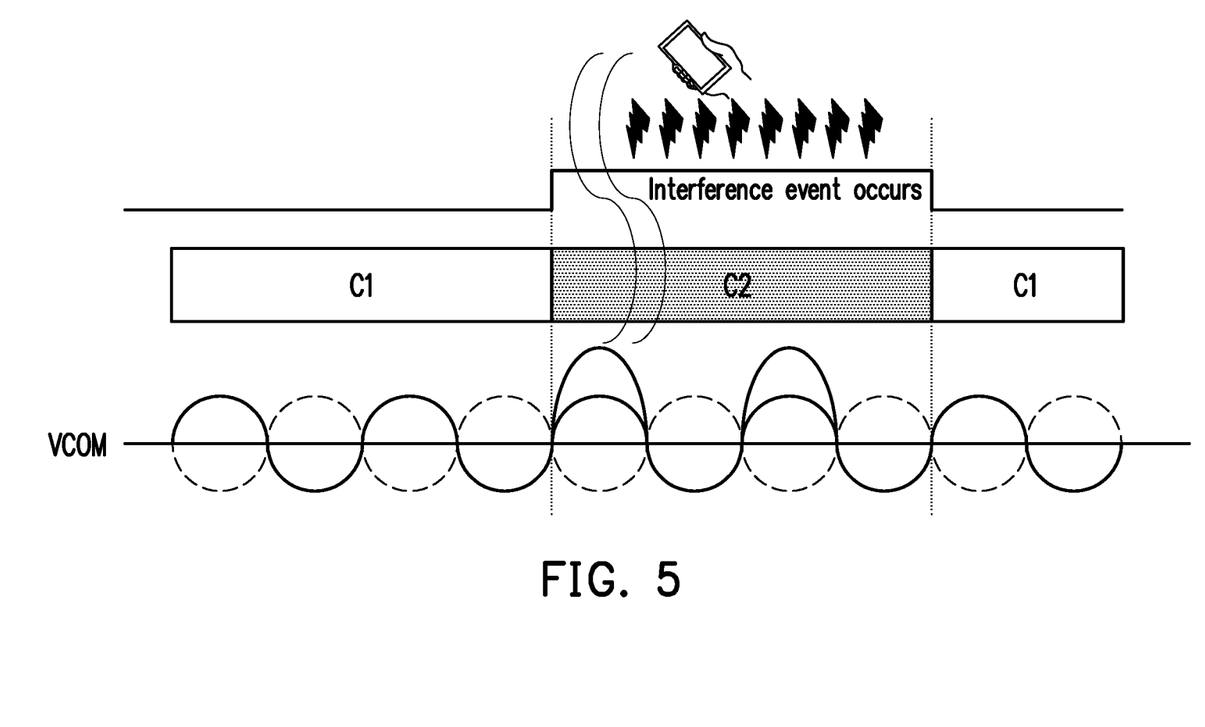
FIG. 5 is a schematic signal timing diagram illustrating that an interference event occurs according to an embodiment of the invention.

A manner of noise detection by the noise sensing circuit 441 is not limited in the present embodiment. For example, FIG. 5 is a schematic signal timing diagram illustrating that an interference event occurs according to an embodiment of the invention. Referring to FIG. 4 and FIG. 5, the noise sensing circuit 441 may detect a common-mode level VCOM of the input signal Sin. When an interference event (for example, the interference scenario illustrated in FIG. 1 and FIG. 2) occurs, the RF noise may probably interfere the transmission of the input signal Sin, which causes the common-mode level VCOM of a common mode voltage of the input signal Sin to change, namely, a ripple occurs to the common mode voltage. The noise sensing circuit 441 may detect a common-mode level VCOM of the input signal Sin. When the common-mode level VCOM is greater than an upper threshold and/or less than a lower threshold, the noise sensing circuit 441 may determine that "the interference event occurs". In the present embodiment, the upper threshold and the lower threshold may be set based on a design requirements. On the contrary, when the common-mode level VCOM is not greater than the upper threshold and is not less than the lower threshold, the noise sensing circuit 441 may determine that "the interference event does not occur".

When the interference event (for example, the interference scenario illustrated in FIG. 1 and FIG. 2) does not occur, the noise sensing circuit 441 may control the variable capacitor 442 to provide a normal capacitance value C1. When the interference event (for example, the interference scenario illustrated in FIG. 1 and FIG. 2) occurs, the noise sensing circuit 441 may adjust a capacitance value of the variable capacitor 442 from the normal capacitance value to at least one anti-interference capacitance value. For example, the capacitance value of the variable capacitor 442 may be adjusted from the normal capacitance value C1 to an anti-interference capacitance value C2. After the interference event disappears, the capacitance value (i.e., the variable capacitance) of the variable capacitor 442 may be adjusted from the anti-interference capacitance value C2 to the normal capacitance value C1.

In some embodiments, the variable capacitor 442 may be coupled to a transmission path (i.e., the conductive wire 451) between the first IC 410 and the second IC 420 through a switch (not shown). Whether or not the switch is turned on is determined based on a control signal generated by the noise sensing circuit 441, thereby determining whether or not to couple the variable capacitor 442 to the conductive wire 451. The noise sensing circuit 441 may detect whether or not a noise size and/or a frequency of the conductive wire 451 fall within a predetermined range, so as to determine or not the interference event occurs. When the noise sensing circuit 441 detects that the interference event occurs, the noise sensing circuit 441 controls the switch (not shown) to be turned on, so as to couple the variable capacitor 442 to the conductive wire 451. Otherwise, when the noise sensing circuit 441 detects that the interference event does not occur, the noise sensing circuit 441 controls the switch (not shown) to be turned off, so as not to couple the variable capacitor 442 to the conductive wire 451.

The embodiment illustrated in FIG. 5 uses an anti-interference capacitance value (i.e., C2). However, in other embodiments, the noise sensing circuit 441 may select one from a plurality of anti-interference capacitance value according to the detection result. Namely, the anti-interference circuit 440 may be configured to determine which one of the anti-interference capacitance values the variable capacitance is adjusted to according to the detection result.

Figure 6:
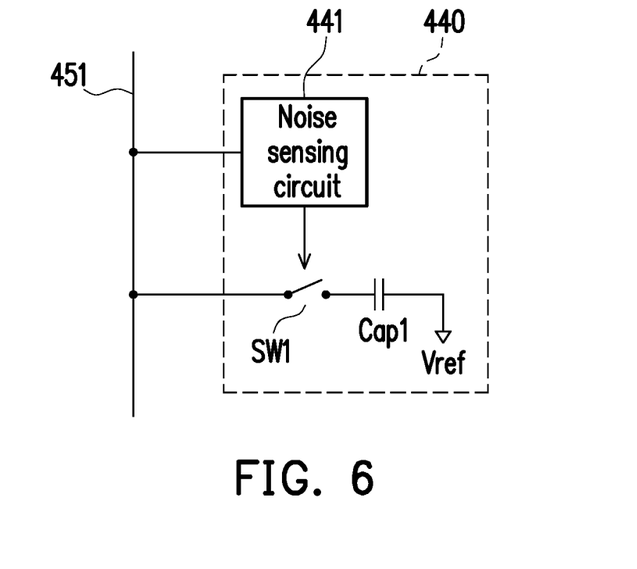
FIG. 6 is a schematic circuit block diagram illustrating the anti-interference circuit according to an embodiment of the invention.

In some embodiments, the anti-interference circuit 440 includes a capacitor and a switch. For example, FIG. 6 is a schematic circuit block diagram illustrating the anti-interference circuit 440 according to an embodiment of the invention. In the embodiment illustrated in FIG. 6, the anti-interference circuit 440 includes a noise sensing circuit 441, a switch SW1 and a capacitor Cap1. The capacitor Cap1 has a fixed capacitance. The noise sensing circuit 441 illustrated in FIG. 6 may be inferred with reference to the description related to the noise sensing circuit 441 illustrated in FIG. 4 and thus, will not be repeated. A first terminal of the switch SW1 is coupled to the conductive wire 451. A control terminal of the switch SW1 is coupled to the noise sensing circuit 441. A first node of the capacitor Capt is coupled to a second terminal of the switch SW1. A second node of the capacitor Capt is coupled to the reference voltage level Vref. The switch SW1 is configured to be turned on when the interference event occurs and turned off when the interference event does not occur.

Figure 7:
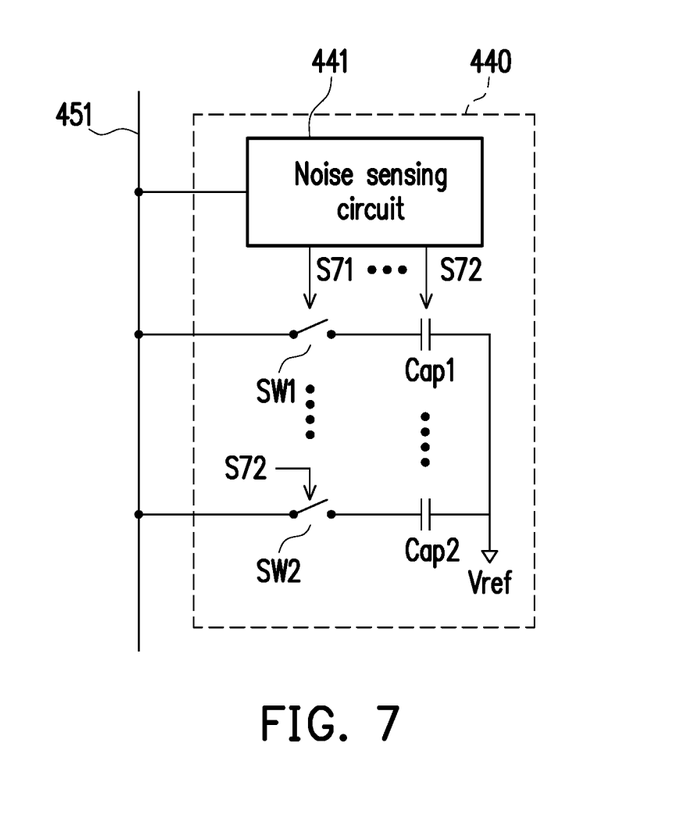
FIG. 7 is a schematic circuit block diagram illustrating the anti-interference circuit according to another embodiment of the invention.

In some embodiments, the anti-interference circuit 440 includes a plurality of capacitors and a plurality of switches. For example, FIG. 7 is a schematic circuit block diagram illustrating the anti-interference circuit 440 according to another embodiment of the invention. In the embodiment illustrated in FIG. 7, the anti-interference circuit 440 includes a noise sensing circuit 441, a switch SW1, a switch SW2, a capacitor Capt and a capacitor Cap2. The noise sensing circuit 441 illustrated in FIG. 7 may be inferred with reference to the description related to the noise sensing circuit 441 illustrated in FIG. 4 and thus, will not be repeated. First terminals of the switch SW1 and the switch SW2 are coupled to the conductive wire 451. A control terminal of the switch SW1 is coupled to the noise sensing circuit 441 to receive a control signal S71. A control terminal of the switch SW2 is coupled to the noise sensing circuit 441 to receive a control signal S72. A first node of the capacitor Capt is coupled to a second terminal of the switch SW1. A first node of the capacitor Cap2 is coupled to a second terminal of the switch SW2. Second nodes of the capacitor Cap1 and the capacitor Cap2 are coupled to the reference voltage level Vref.

The capacitors Cap1 and Cap2 may respectively have the same or different fixed capacitance values. Each of the capacitors Cap1 and Cap2 is coupled to the transmission path (i.e., the conductive wire 451) between the first IC 410 and the second IC 420 respectively through a corresponding one of the switches SW1 and SW2. Each of the switches SW1 and SW2 may be controlled by the control signal generated by the noise sensing circuit 441, so as to determine whether the coupled capacitor is coupled to the conductive wire 451. The noise sensing circuit 441 may detect different conditions of the noise, for example, detect whether or not the noise size and/or the frequency of the conductive wire 451 fall within different predetermined ranges, so as to determine different conditions of the noise. When the noise sensing circuit 441 detects different conditions of the noise, the noise sensing circuit 441 turns on a part of the switches SW1 and SW2 and turns off another part of the switches SW1 and SW2, so as to couple a corresponding one (or multiple corresponding ones) of the capacitors Cap1 and Cap2 to the conductive wire 451. Thus, in different conditions of the noise, the anti-interference circuit 440 has different capacitance values for being coupled to the conductive wire 451.

For example, in a first noise condition (for example, no noise occurs), a first one of the switches SW1 and SW2 is turned off, a second one of the switches SW1 and SW2 is turned on, and thus, only a second one of the capacitors Cap1 and Cap2 is coupled to the conductive wire 451. In a second noise condition (for example, the noise size and/or the frequency fall within the predetermined range), the first switch and the second switch (the switches SW1 and SW2) are both turned on, and thus, the first and the second capacitors (the capacitors Cap1 and Cap2) are both coupled to the conductive wire 451.

In another embodiment, in the first noise condition (for example, no noise occurs), the first switch and the second switch (the switches SW1 and SW2) are both turned off, and thus, none of the capacitors Cap1 and Cap2 are coupled to the conductive wire 451. In the second noise condition (for example, the noise size and/or the frequency fall within a first predetermined range), the first switch of the switches SW1 and SW2 is turned on, the second switch of the switches SW1 and SW2 is turned off, and thus, only the first capacitor of the capacitors Cap1 and Cap2 is coupled to the conductive wire 451. In a third noise condition (for example, the noise size and/or the frequency fall within a second predetermined range), the first switch of the switches SW1 and SW2 is turned off, the second switch of the switches SW1 and SW2 is turned on, and thus, only the second capacitor of the capacitors Cap1 and Cap2 is coupled to the conductive wire 451. In the same or another embodiment, in a fourth noise condition (for example, the noise size and/or the frequency fall within a third predetermined range), the first switch and the second switch of the switches SW1 and SW2 are both turned on, and thus, the first capacitor and the second capacitor of the capacitors Cap1 and Cap2 are both coupled to the conductive wire 451.

The descriptions above are made with the use of one and two switches for example, but the switches in other numbers may be inferred in the same way by analogy. In other embodiments, sizes of the capacitances may be adjusted by any known manners, for example, by using any circuit capable of implementing the variable capacitance.

Figure 8:
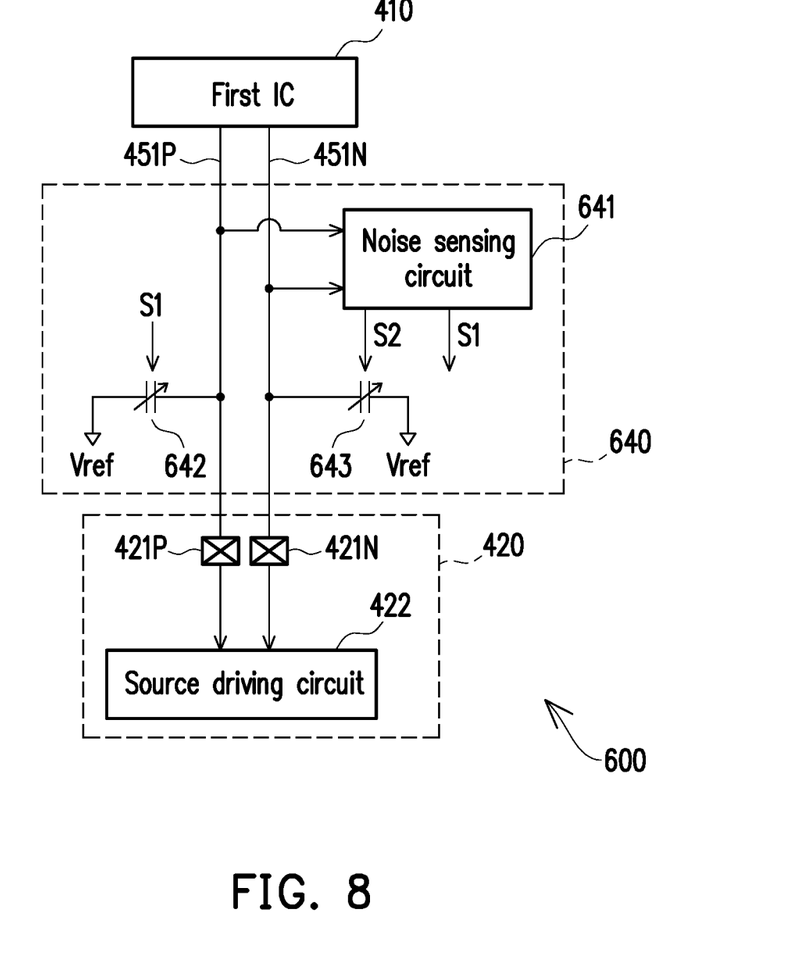
FIG. 8 is a schematic circuit block diagram illustrating a display device according to yet another embodiment of the invention.

FIG. 8 is a schematic circuit block diagram illustrating a display device 600 according to yet another embodiment of the invention. The display device 600 includes a first IC 410, a second IC 420 and an anti-interference circuit 640. The first IC 410, the second IC 420 and the anti-interference circuit 640 illustrated in FIG. 8 may be inferred with reference to the descriptions related to the first IC 410, the second IC 420 and the anti-interference circuit 440 illustrated in FIG. 4 and will not be repeated. In the embodiment illustrated in FIG. 8, a differential input terminal pair (including an input pad 421P and an input pad 421N) of the second IC 420 is electrically coupled to the first IC 410 via a conductive wire 451P and a conductive wire 451N of the printed circuit board 450 to receive a differential input signal including image data.

The implementation manner of the anti-interference circuit 640 is not limited in the present embodiment. For example, the anti-interference circuit 640 illustrated in FIG. 8 includes a noise sensing circuit 641, a capacitor 642 and a capacitor 643. The capacitor 642 and/or the capacitor 643 have fixed capacitances or variable capacitances. A first node of the capacitor 642 is coupled to the conductive wire 451P. A second node of the capacitor 642 is coupled to a reference voltage level Vref. A first node of the capacitor 643 is coupled to the conductive wire 451N. A second node of the capacitor 643 is coupled to the reference voltage level Vref. The noise sensing circuit 641 may detect whether or not an interference event occurs to the differential input signal of the conductive wires 451P and 451N. For example, the noise sensing circuit 641 of the anti-interference circuit 640 may detect at least one of a frequency of differential input signal, a common-mode level of the differential input signal and a swing of the differential input signal, so as to obtain a detection result indicating whether or not interference event occurs. The noise sensing circuit 641 may determine whether to dynamically adjust or maintain the capacitance value (i.e., the variable capacitance) of the variable capacitor 442 according to the detection result. Based on a control signal S1 of the noise sensing circuit 641, the capacitor 642 may provide the variable capacitance to the conductive wire 451P. Based on a control signal S2 of the noise sensing circuit 641, the capacitor 643 may provide the variable capacitance to the conductive wire 451N. The noise sensing circuit 641, the capacitor 642 and the capacitor 643 illustrated in FIG. 8 may be inferred with reference to the descriptions related to the noise sensing circuit 441 and the variable capacitor 442 illustrated in FIG. 4 and thus, will not be repeated.

The implementation manner of the second IC 420 is not limited in the present embodiment. For example, the second IC 420 illustrated in FIG. 8 includes the input pad 421P, the input pad 421N and the source driving circuit 422. The input pad 421P is electrically coupled to the first IC 410 via the conductive wire 451P of the printed circuit board to receive a first terminal signal of the differential input signal. The input pad 421N is electrically coupled to the first IC 410 via the conductive wire 451N of the printed circuit board to receive a second terminal signal of the differential input signal. The source driving circuit 422 is coupled to the input pad 421P and the input pad 421N to receive the differential input signal. The source driving circuit 422 may process the input signal to generate output data to drive the display panel.

The anti-interference circuit 440 is disposed on the printed circuit board 450 in the embodiment illustrated in FIG. 4, and the anti-interference circuit 640 is disposed on the printed circuit board in the embodiment illustrated in FIG. 8. Based on a design requirement, in other embodiments, the anti-interference circuit may be disposed inside the first IC 410 (for example, the timing control circuit 310) and/or inside the second IC 420 (for example, the source driving circuit).

Figure 9:
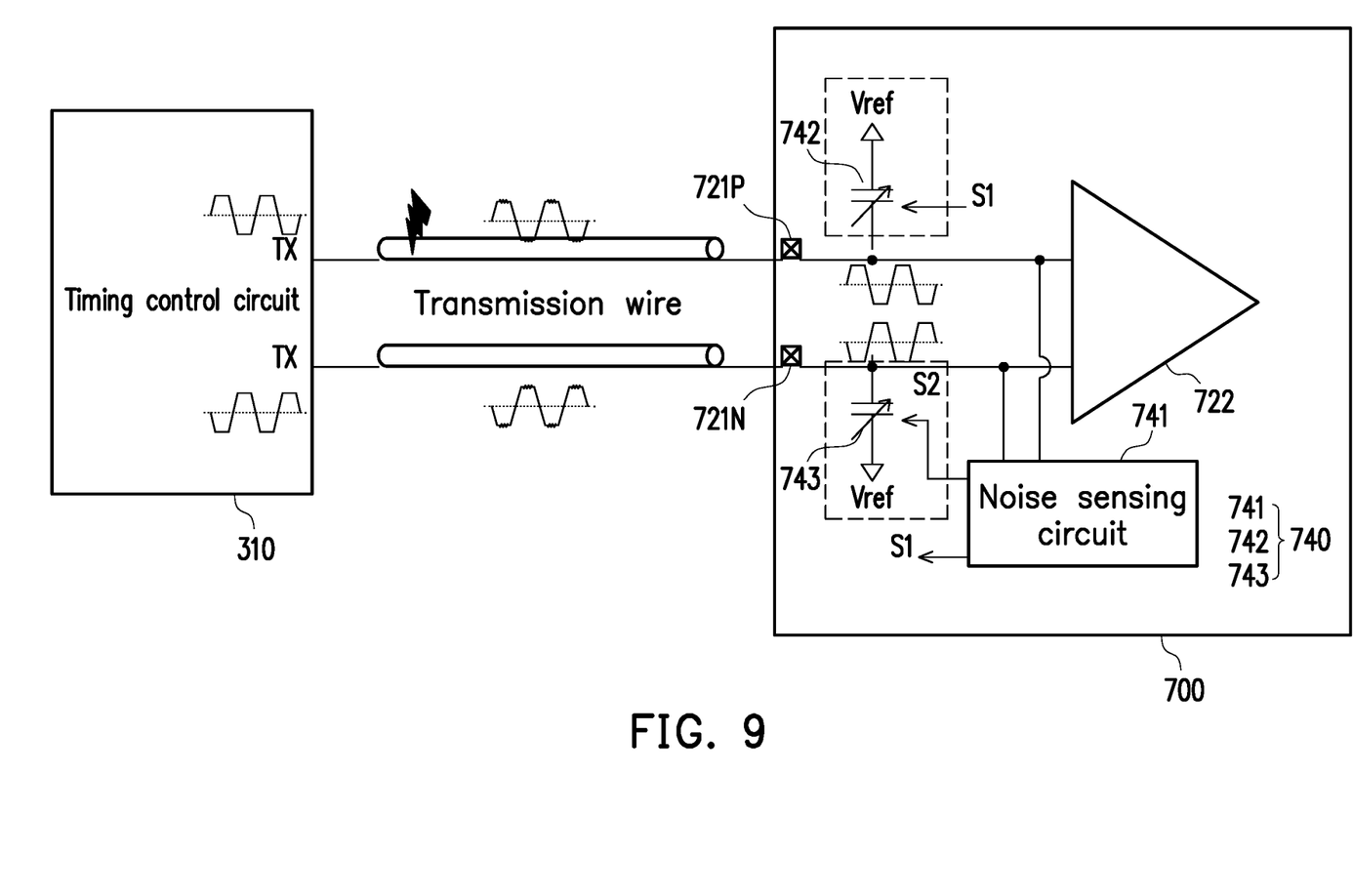
FIG. 9 is a schematic circuit block diagram illustrating a display device according to still another embodiment of the invention.

FIG. 9 is a schematic circuit block diagram illustrating a display device according to still another embodiment of the invention. The display device illustrated in FIG. 9 includes a timing control circuit 310 and an IC 700. The timing control circuit 310 illustrated in FIG. 9 may be inferred with reference to the description related to the timing control circuit 310 illustrated in FIG. 3, and/or the timing control circuit 310 illustrated in FIG. 9 may be inferred with reference to the description related to the first IC 410 illustrated in FIG. 4 and thus, will not be repeated. The IC 700 may drive the display panel. The IC 700 illustrated in FIG. 9 may be inferred with reference to the description related to any one of the source driving circuits 321-324 illustrated in FIG. 3, and/or The IC 700 illustrated in FIG. 9 may be inferred with reference to the description related to the second IC 420 illustrated in FIG. 8 and thus, will not be repeated. In the embodiment illustrated in FIG. 9, a differential input terminal pair (including an input pad 721P and an input pad 721N) of the IC 700 is electrically coupled to the timing control circuit 310 via a transmission wire pair (i.e., a conductive wire pair) to receive a differential input signal including image data.

The IC 700 illustrated in FIG. 9 includes the input pad 721P, the input pad 721N, a source driving circuit 722 and an anti-interference circuit 740. The input pad 721P and the input pad 721N may receive the input signal including the image data from the external. The source driving circuit 722 is coupled to the input pad 721P and the input pad 721N to receive the input signal. For example, the source driving circuit 722 includes a receiving circuit, wherein a first input terminal of the receiving circuit is coupled to the input pad 721P, and a second input terminal of the receiving circuit is coupled to the input pad 721N. The source driving circuit 722 may process the input signal so as to generate output data to drive the display panel.

The anti-interference circuit 740 is coupled to the input pad 721P and the input pad 721N to provide a variable capacitance. When an interference event does not occur, the anti-interference circuit 740 may maintain the variable capacitance at a normal capacitance value. The normal capacitance value may be determined based on a design requirement. For example, in some embodiments, the normal capacitance value may be 0. When the interference event occurs to the input signal, the anti-interference circuit 740 may adjust the variable capacitance from the normal capacitance value to at least one anti-interference capacitance value. The anti-interference capacitance value may be determined based on a design requirement. For example, in some embodiments, the anti-interference capacitance value may be any real number greater than the normal capacitance value. When the interference event disappears, the anti-interference circuit 740 may return the variable capacitance from the anti-interference capacitance value to the normal capacitance value.

The implementation manner of the anti-interference circuit 740 is not limited in the present embodiment. For example, the anti-interference circuit 740 illustrated in FIG. 9 includes a noise sensing circuit 741, a capacitor 742 and a capacitor 743. The capacitor 742 and/or capacitor 743 has fixed capacitances or variable capacitances. A first node of the capacitor 742 is coupled to the input pad 721P and the first input terminal of the receiving circuit of the source driving circuit 722. A second node of the capacitor 742 is coupled to a reference voltage level Vref. A first node of the capacitor 743 is coupled to the input pad 721N and the second input terminal of the receiving circuit of the source driving circuit 722. A second node of the capacitor 743 is coupled to the reference voltage level Vref.

The noise sensing circuit 741 may detect whether or not the interference event occurs to the differential input signal of the input pad 721P and the input pad 721N, i.e., whether or not the interference event occurs to the transmission wire. According to a detection result, the noise sensing circuit 741 may change capacitance values of the capacitor 742 and the capacitor 743, so as to achieve an effect of suppressing the noise. For example, the noise sensing circuit 741 of the anti-interference circuit 740 may detect at least one of a frequency of the input signal, a common-mode level of the input signal and a swing of the input signal, so as to obtain the detection result indicating whether or not the interference event occurs. The noise sensing circuit 741 may dynamically adjust or maintain the capacitance values (i.e., the variable capacitances) of the capacitor 742 and/or the capacitor 743 according to the detection result. Based on a control signal S1 of the noise sensing circuit 741, the capacitor 742 may provide the variable capacitance to the input pad 721P. Based on a control signal S2 of the noise sensing circuit 741, the capacitor 743 may provide the variable capacitance to the input pad 721N. The noise sensing circuit 741, the capacitor 742 and the capacitor 743 illustrated in FIG. 9 may be inferred with reference to the descriptions related to the noise sensing circuit 641, the capacitor 642 and the capacitor 643 illustrated in FIG. 8 or may be inferred with reference to the descriptions related to the noise sensing circuit 441 and the variable capacitor 442 illustrated in FIG. 4 and thus, will not be repeated.

The noise sensing circuit 741 illustrated in FIG. 9 may be inferred with reference to the description related to the embodiment illustrated in FIG. 5. In other embodiments, the noise sensing circuit 741 illustrated in FIG. 9 may select one from a plurality of anti-interference capacitance values according to the detection result. Namely, the anti-interference circuit 740 may be configured to determine which one of the anti-interference capacitance values the variable capacitance is adjusted to according to the detection result.

Figure 10:
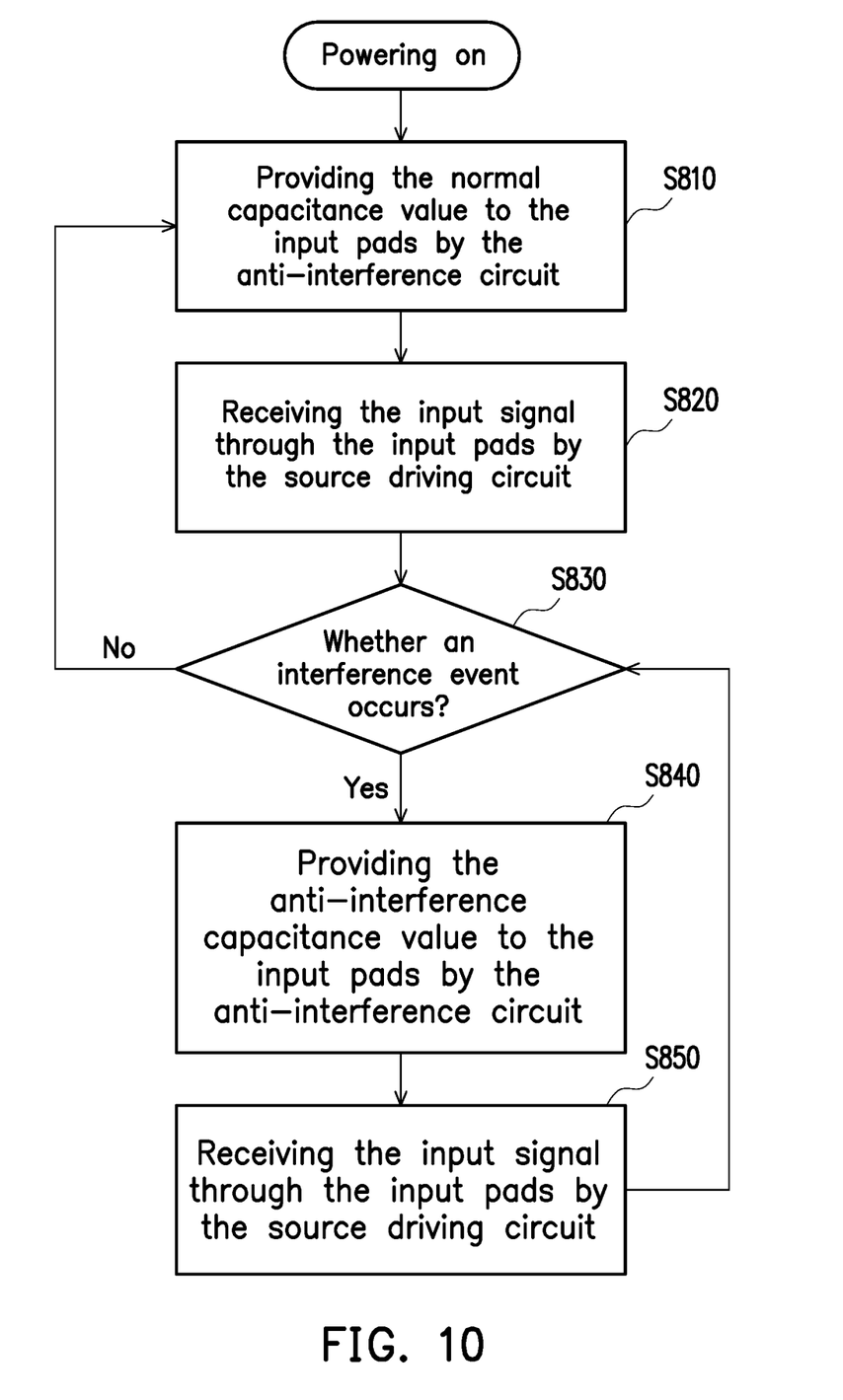
FIG. 10 is a flowchart illustrating an anti-interference method of a driving circuit according to an embodiment of the invention.

FIG. 10 is a flowchart illustrating an anti-interference method of a driving circuit according to an embodiment of the invention. Referring to FIG. 9 and FIG. 10, after the timing control circuit 310 and the IC 700 are powered on, the timing control circuit 310 and the IC 700 enter a clock training. In the clock training mode, the timing control circuit 310 serves a clock training data string as a data signal and transmits it to the IC 700. Operation details in the clock training mode are not limited in the present embodiment. For example, the operation details related to the clock training mode may be a conventional clock training operation or other operations. In this circumstance, a clock data recovery (CDR) circuit (not shown) inside the IC 700 may perform a frequency lock operation and/or a phase lock operation on the clock training data string provided by the timing control circuit 310. After the clock training mode ends, the CDR circuit of the IC 700 is capable of correctly locking the clock training data string provided by the timing control circuit 310, and thus, the timing control circuit 310 and the IC 700 enter a normal mode.

The anti-interference circuit 740 may provide the variable capacitance to the input pad 721P and the input pad 721N. In a normal mode, the anti-interference circuit 740 sets/maintains the variable capacitance to/at the normal capacitance value. Namely, the anti-interference circuit 740 provides the normal capacitance value to the input pad 721P and the input pad 721N (step S810). The normal capacitance value may be determined based on a design requirement. For example, in some embodiments, the normal capacitance value may be 0 or other capacitance values. In this circumstance, the source driving circuit 722 receives the input signal including the image data from the externa; through the input pad 721P and the input pad 721N, and the source driving circuit 722 processes the input signal to generate the output data to drive the display panel (step S820).

The anti-interference circuit 740 may detect whether or not an interference event occurs (step S830). When the interference event does not occur (the determination result of step S830 is "No"), step S810 and step S820 are again performed. Namely, when the interference event does not occur, the anti-interference circuit 740 maintains the variable capacitance at the normal capacitance value, and the IC 700 receives the input signal including the image data at the normal capacitance value.

When the interference event (for example, the interference scenario illustrated in FIG. 1 and FIG. 2) occurs, the RF noise may interfere the data signal transmission between the timing control circuit 310 and the IC 700, such that the common-mode level VCOM of the common mode voltage of the data signal changes (as illustrated in FIG. 5). When the interference event occurs (the determination result of step S830 is "Yes"), the anti-interference circuit 740 may adjust the variable capacitance from the normal capacitance value to the anti-interference capacitance value (from the normal capacitance value C1 to the anti-interference capacitance value C2 as illustrated in FIG. 5). Namely, the anti-interference circuit 740 provides the anti-interference capacitance value to the input pad 721P and the input pad 721N (step S840). In this circumstance, the source driving circuit 722 receives the input signal including the image data from the external through the input pad 721P and the input pad 721N, and the source driving circuit 722 processes the input signal to generate the output data to drive the display panel (step S850).

The anti-interference capacitance value may be determined based on a design requirement. For example, in some embodiments, the anti-interference capacitance value may be 2.2 pF, 5 pF, 10 pF or any real number greater than the normal capacitance value. Based on a design requirement, the anti-interference capacitance value may be a fixed value or a dynamic value (which depends on a severity degree of the interference event). This fixed value may be determined according to experiments, for example, and related to a data rate.

In some embodiments, when the interference event occurs, the noise sensing circuit 741 may dynamically adjust the capacitance values of the capacitor 742 and the capacitor 743. For example, the noise sensing circuit 741 may set the sizes of the capacitance values of the capacitor 742 and the capacitor 743 according to the noise size or the frequency range. For example, when the noise size or the frequency falls within a first range, the noise sensing circuit 741 may set the capacitance values of the capacitor 742 and the capacitor 743 to a first capacitance value. When the noise or the frequency falls within a second range, the noise sensing circuit 741 may set the capacitance values of the capacitor 742 and the capacitor 743 to a second capacitance value.

After step S850, step S830 is again performed. Namely, the anti-interference circuit 740 may again detect whether or not the interference event occurs. Thus, when the interference event disappears, the anti-interference circuit 740 may return the variable capacitance from the anti-interference capacitance value to the normal capacitance value (step S810).

Figure 11:
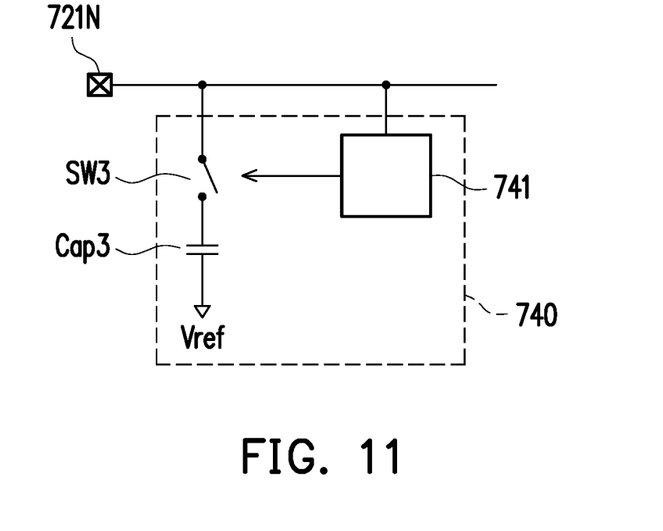
FIG. 11 is a schematic circuit block diagram illustrating the anti-interference circuit 740 according to an embodiment of the invention.

In some embodiments, the anti-interference circuit 740 includes a capacitor and a switch. For example, FIG. 11 is a schematic circuit block diagram illustrating the anti-interference circuit 740 according to an embodiment of the invention. In the embodiment illustrated in FIG. 11, the anti-interference circuit 740 includes a noise sensing circuit 741, a switch SW3 and a capacitor Cap3. The capacitor Cap3 has a fixed capacitance. The noise sensing circuit 741 illustrated in FIG. 11 may be inferred with reference to the description related to the noise sensing circuit 741 illustrated in FIG. 9 and thus, will not be repeated. A first terminal of the switch SW3 is coupled to the input pad 721N. A control terminal of the switch SW3 is coupled to the noise sensing circuit 741. A first node of the capacitor Cap3 is coupled to a second terminal of the switch SW3. A second node of the capacitor Cap3 is coupled to the reference voltage level Vref. The switch SW3 is configured to be turned on when the interference event occurs and turned off when the interference event does not occur.

Figure 12:
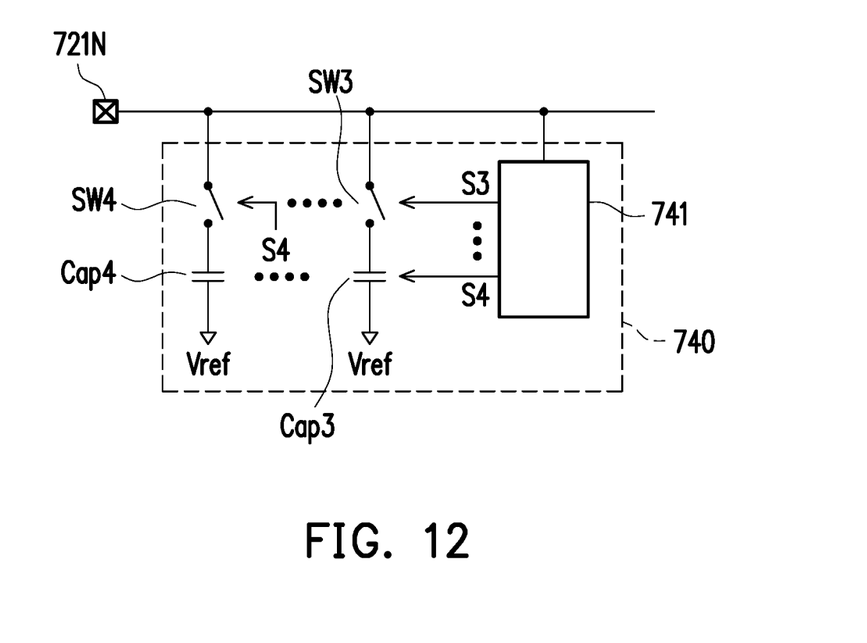
FIG. 12 is a schematic circuit block diagram illustrating the anti-interference circuit 740 according to another embodiment of the invention.

In some embodiments, the anti-interference circuit 740 includes a plurality of capacitors and a plurality of switches. For example, FIG. 12 is a schematic circuit block diagram illustrating the anti-interference circuit 740 according to another embodiment of the invention. In the embodiment illustrated in FIG. 12, the anti-interference circuit 740 includes a noise sensing circuit 741, a switch SW3, a switch SW4, a capacitor Cap3 and a capacitor Cap4. The noise sensing circuit 741 illustrated in FIG. 12 may be inferred with reference to the description related to the noise sensing circuit 741 illustrated in FIG. 9 and thus, will not be repeated. First terminals of the switch SW3 and the switch SW4 are coupled to the input pad 721N. A control terminal of the switch SW3 is coupled to the noise sensing circuit 741 to receive a control signal S3. A control terminal of the switch SW4 is coupled to the noise sensing circuit 741 to receive a control signal S4. A first node of the capacitor Cap3 is coupled to a second terminal of the switch SW3. A first node of the capacitor Cap4 is coupled to a second terminal of the switch SW4. Second nodes of the capacitor Cap3 and the capacitor Cap4 are coupled to the reference voltage level Vref.

Based on the above, the integrated circuit, the display device and the anti-interference method provided by the embodiments of the invention can determine whether or not the interference event occurs to the input signal. When the interference event occurs, the variable capacitance of the anti-interference circuit can be dynamically adjusted from the normal capacitance value to the anti-interference capacitance value, so as to suppress the RF noise. In some embodiments, the anti-interference capacitance value may be a single capacitance value. In other embodiments, the anti-interference capacitance value may include a plurality of capacitance values. The noise sensing circuit may select a corresponding capacitance value from the anti-interference capacitance values according to different noise conditions (the degree of the interference event). When the interference event does not occur, the variable capacitance of the anti-interference circuit can be maintained at (adjusted back to) the normal capacitance value.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An integrated circuit, configured to drive a display panel, comprising:
   at least one input pad, configured to receive an image data signal via a conductive wire;
   a source driving circuit, coupled to the at least one input pad to receive the image data signal, and processing the image data signal to generate output data to drive the display panel; and
   an anti-interference circuit, coupled to the at least one input pad to detect whether or not an interference event occurs to the image data signal of the conductive wire, wherein the anti-interference circuit comprises a variable capacitor, the variable capacitor is directly connected to the conductive wire, the variable capacitor provides a variable capacitance for the image data signal to the conductive wire through the at least one input pad, and the anti-interference circuit is configured to adjust the variable capacitance from a normal capacitance value to at least one anti-interference capacitance value when the interference event occurs and maintain the variable capacitance at the normal capacitance value when the interference event does not occur.

2. The integrated circuit according to claim 1, wherein the anti-interference circuit comprises one or more capacitors, each of the capacitors having a first node coupled to one of the at least one input pad.

3. The integrated circuit according to claim 2, wherein each of the capacitors has a second node coupled to a reference voltage level.

4. The integrated circuit according to claim 3, wherein at least one capacitor of the one or more capacitors has a fixed capacitance and the anti-interference circuit further comprises at least one switch coupled to the at least one capacitor.

5. The integrated circuit according to claim 3, wherein the anti-interference circuit comprises a capacitor and a switch coupled between the input pad and the reference voltage level, wherein the switch is configured to be turned on when the interference event occurs and turned off when the interference event does not occur.

6. The integrated circuit according to claim 2, wherein at least one capacitor of the one or more capacitors has a variable capacitance.

7. The integrated circuit according to claim 2, wherein the at least one input pad comprises a first input pad and a second input pad, the source driving circuit comprises a receiving circuit, a first input terminal of the receiving circuit is coupled to the first input pad, a second input terminal of the receiving circuit is coupled to the second input pad, and the capacitors comprises a first capacitor coupled between the first input pad and the first input terminal of the receiving circuit and a second capacitor coupled between the second input pad and the second input terminal of the receiving circuit.

8. The integrated circuit according to claim 1, wherein the normal capacitance value is 0.

9. The integrated circuit according to claim 1, wherein the at least one anti-interference capacitance value is greater than the normal capacitance value.

10. The integrated circuit according to claim 1, wherein the anti-interference circuit is configured to detect at least one of a frequency of the image data signal, a common-mode level of the image data signal and a swing of the image data signal to obtain a detection result indicating whether or not the interference event occurs and determines whether to adjust or maintain the variable capacitance according to the detection result.

11. The integrated circuit according to claim 10, wherein the anti-interference circuit is further configured to determine which one of the at least one anti-interference capacitance value the variable capacitance is adjusted to according to the detection result.

12. The integrated circuit according to claim 1, wherein after the interference event disappears, the anti-interference circuit returns the variable capacitance from the at least one anti-interference capacitance value to the normal capacitance value.

13. The integrated circuit according to claim 1, wherein the image data signal comprises a differential image data signal.

14. The integrated circuit according to claim 1, wherein the variable capacitance is provided to suppress a noise of the interference event occurring to the image data signal.

15. An anti-interference method of an integrated circuit configured to drive a display panel, comprising:
   receiving an image data signal through at least one input pad and via a conductive wire by a source driving circuit;
   processing the image data signal to generate output data by the source driving circuit to drive the display panel;
   detecting whether or not an interference event occurs to the image data signal of the conductive wire by an anti-interference circuit, wherein the anti-interference circuit comprises a variable capacitor, and the variable capacitor is directly connected to the conductive wire;
   providing a variable capacitance for the image data signal to the conductive wire through the at least one input pad by the variable capacitor;
   adjusting the variable capacitance from a normal capacitance value to at least one anti-interference capacitance value by the anti-interference circuit when the interference event occurs; and
   maintaining the variable capacitance at the normal capacitance value by the anti-interference circuit when the interference event does not occur.

16. The anti-interference method according to claim 15, wherein the normal capacitance value is 0.

17. The anti-interference method according to claim 15, wherein the at least one anti-interference capacitance value is greater than the normal capacitance value.

18. The anti-interference method according to claim 15, further comprising:
   detecting at least one of a frequency of the image data signal, a common-mode level of the image data signal and a swing of the image data signal to obtain a detection result indicating whether or not the interference event occurs by the anti-interference circuit; and
   determining whether to adjust or maintain the variable capacitance according to the detection result.

19. The anti-interference method according to claim 18, further comprising:
   determining, by the anti-interference circuit, which one of the at least one anti-interference capacitance value the variable capacitance is adjusted to according to the detection result.

20. The anti-interference method according to claim 15, further comprising:
   after the interference event disappears, returning the variable capacitance from the at least one anti-interference capacitance value to the normal capacitance value by the anti-interference circuit.

21. The anti-interference method according to claim 15, wherein the image data signal comprises a differential image data signal.

22. The anti-interference method according to claim 15, wherein the variable capacitance is provided to suppress a noise of the interference event occurring to the image data signal.

23. A display device, comprising:
a display panel;
a printed circuit board, coupled to the display panel;
a first integrated circuit, disposed on the printed circuit board;
a second integrated circuit, receiving an image data signal from the first integrated circuit via a conductive wire; and
an anti-interference circuit, disposed on the printed circuit board, and coupled to the conductive wire to detect whether or not an interference event occurs to the image data signal, wherein the anti-interference circuit comprises a variable capacitor, the variable capacitor is directly connected to the conductive wire, and the variable capacitor provides a variable capacitance for the image data signal to the conductive wire,
wherein the anti-interference circuit is configured to adjust the variable capacitance from a normal capacitance value to at least one anti-interference capacitance value when the interference event occurs and maintain the variable capacitance at the normal capacitance value when the interference event does not occur.

24. The display device according to claim 23, wherein the first integrated circuit comprises a timing control circuit and the second integrated circuit comprises a source driving circuit.

25. The display device according to claim 23, wherein the anti-interference circuit comprises one or more capacitors, each of the capacitors having a first node coupled to one of the at least one conductive wire.

26. The display device according to claim 25, wherein each of the capacitors has a second node coupled to a reference voltage level.

27. The display device according to claim 26, wherein at least one capacitor of the one or more capacitors has a fixed capacitance and the anti-interference circuit further comprises at least one switch coupled to the at least one capacitor.

28. The display device according to claim 26, wherein the anti-interference circuit comprises a capacitor and a switch coupled between the at least one conductive wire and the reference voltage level, wherein the switch is configured to be turned on when the interference event occurs and turned off when the interference event does not occur.

29. The display device according to claim 25, wherein at least one capacitor of the one or more capacitors has a variable capacitance.

30. The display device according to claim 25, wherein the at least one conductive wire comprises a first conductive wire and a second conductive wire, first input pad of the source driving circuit is coupled to the first conductive wire, a second input pad of the source driving circuit is coupled to the second conductive wire, the capacitors comprise a first capacitor coupled to the first conductive wire and a second capacitor coupled to the second conductive wire.

31. The display device according to claim 23, wherein the second integrated circuit comprises:
an input pad, configured to be electrically coupled to the first integrated circuit via the conductive wire of the printed circuit board to receive the image data signal; and
a source driving circuit, coupled to the input pad to receive the image data signal and processing the image data signal to generate output data to drive the display panel.

32. The display device according to claim 23, wherein the normal capacitance value is 0.

33. The display device according to claim 23, wherein the at least one anti-interference capacitance value is greater than the normal capacitance value.

34. The display device according to claim 23, wherein the anti-interference circuit is configured to detect at least one of a frequency of the image data signal, a common-mode level of the image data signal and a swing of the image data signal to obtain a detection result indicating whether or not the interference event occurs and determines whether to adjust or maintain the variable capacitance according to the detection result.

35. The display device according to claim 34, wherein the anti-interference circuit is further configured to determine which one of the at least one anti-interference capacitance value the variable capacitance is adjusted to according to the detection result.

36. The display device according to claim 23, wherein after the interference event disappears, the anti-interference circuit returns the variable capacitance from the at least one anti-interference capacitance value to the normal capacitance value.

37. The display device according to claim 23, wherein the image data signal comprises a differential image data signal.

38. The display device according to claim 23, wherein the variable capacitance is provided to suppress a noise of the interference event occurring to the image data signal.

* * * * *